US010908509B2

(12) United States Patent
Lippert et al.

(10) Patent No.: US 10,908,509 B2
(45) Date of Patent: Feb. 2, 2021

(54) MIRROR, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Johannes Lippert, Buch am Wald (DE); Toralf Gruner, Aalen (DE); Kerstin Hild, Schwaebisch Gmuend (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/587,974

(22) Filed: Sep. 30, 2019

(65) Prior Publication Data
US 2020/0026195 A1    Jan. 23, 2020

Related U.S. Application Data

(63) Continuation of application No. PCT/EP2018/053769, filed on Feb. 15, 2018.

(30) Foreign Application Priority Data

Mar. 30, 2017    (DE) .................. 10 2017 205 405

(51) Int. Cl.
*G03F 7/20*        (2006.01)
*G02B 5/08*        (2006.01)

(52) U.S. Cl.
CPC ....... *G03F 7/70266* (2013.01); *G02B 5/0891* (2013.01); *G03F 7/702* (2013.01); *G03F 7/70316* (2013.01)

(58) Field of Classification Search
CPC .. G03F 7/702; G03F 7/70266; G03F 7/70316; G03F 7/7015; G03F 7/70191;
(Continued)

(56) References Cited

U.S. PATENT DOCUMENTS 6,198,579 B1    3/2001    Rupp
6,521,877 B1    2/2003    Muller-Rissmann et al.
(Continued)

FOREIGN PATENT DOCUMENTS

DE    102006045075 A1    4/2008
DE    102012212757 A1    1/2014
(Continued)

OTHER PUBLICATIONS

GPTO Office Action with English translation, German Application No. 10 2017 205 405.0, dated Nov. 22, 2017, 14 pages.
(Continued)

*Primary Examiner* — Christina A Riddle
(74) *Attorney, Agent, or Firm* — Edell, Shapiro & Finnan, LLC

(57) ABSTRACT

A mirror, in particular for a microlithographic projection exposure apparatus, has an optical effective surface and includes a substrate (11, 61, 71, 81, 91), a reflection layer system (16, 66, 76, 86, 96) for reflecting electromagnetic radiation impinging on the optical effective surface (10a, 60a, 70a, 80a, 90a), an electrode arrangement (13, 63, 73, 83) composed of a first material having a first electrical conductivity, the electrode arrangement being provided on the substrate, and a mediator layer (12, 62, 72, 82, 92) composed of a second material having a second electrical conductivity. The ratio between the first electrical conductivity and the second electrical conductivity is at least 100. The mirror also includes at least one compensation layer (88) which at least partly compensates for the influence of a thermal expansion of the electrode arrangement (83) on the deformation of the optical effective surface (80a).

20 Claims, 10 Drawing Sheets

(58) Field of Classification Search
CPC ............. G03F 7/70233; G03F 7/70258; G03F 7/70308; G03F 7/7055; G03F 7/70591; G03F 7/706; G03F 7/70858; G03F 7/70883; G03F 7/70891; G03F 7/7095; G03F 7/70958; G02B 5/0891; G02B 5/08; G02B 5/0808; G02B 5/0816–0875; G02B 26/085; G02B 26/0858; G21K 1/062; G21K 2201/067; G21K 2201/065; H01L 41/0805; H01L 41/183; H01L 41/1876
USPC ........ 355/30, 52–55, 66–71, 77; 378/34, 35; 250/492.1, 492.2, 492.22, 505.1, 504 R; 359/350, 359, 360, 838–884
See application file for complete search history.

(56) References Cited

U.S. PATENT DOCUMENTS

| | | | |
|---|---|---|---|
| 7,112,772 | B2 | 9/2006 | Wagner et al. |
| 7,294,814 | B2 | 11/2007 | Wagner et al. |
| 8,508,854 | B2 | 8/2013 | Eva et al. |
| 8,891,172 | B2 | 11/2014 | Eva et al. |
| 9,785,054 | B2 | 10/2017 | Gruner et al. |
| 2001/0040743 | A1* | 11/2001 | Graves .................. G02B 26/06 359/849 |
| 2013/0141707 | A1* | 6/2013 | Baer ..................... B82Y 10/00 355/67 |
| 2014/0104587 | A1* | 4/2014 | Freimann ............. G03F 7/7015 355/67 |
| 2014/0300876 | A1* | 10/2014 | Baer .................. G03F 7/70316 355/30 |
| 2015/0116703 | A1* | 4/2015 | Bittner .................. G01N 21/95 356/237.5 |
| 2016/0209751 | A1* | 7/2016 | Gruner ................. G02B 5/0891 |

FOREIGN PATENT DOCUMENTS

| | | | |
|---|---|---|---|
| DE | 102013219583 | A1 | 4/2015 |
| DE | 102015213273 | A1 | 1/2017 |
| DE | 102016224202 | A1 | 1/2017 |
| DE | 102016201445 | A1 | 2/2017 |
| EP | 0965871 | B1 | 10/2005 |
| EP | 1103857 | B1 | 9/2006 |
| EP | 2103978 | A1 | 9/2009 |
| JP | H10284390 | A | 10/1998 |
| WO | 2004036316 | A1 | 4/2004 |
| WO | 2014012660 | A2 | 1/2014 |
| WO | WO-2015043832 | A1 * | 4/2015 ........... G02B 5/0816 |
| WO | WO-2017009096 | A1 * | 1/2017 ........... G03F 7/7015 |

OTHER PUBLICATIONS

International Preliminary Report on Patentability, PCT/EP2018/053769, dated Oct. 1, 2019, 21 pages.

International Search Report, English translation, PCT/EP2018/053769, dated Nov. 6, 2018, 2 pages.

International Search Report and Written Opinion, PCT/EP2018/053769, dated Nov. 6, 2018, 16 pages.

* cited by examiner

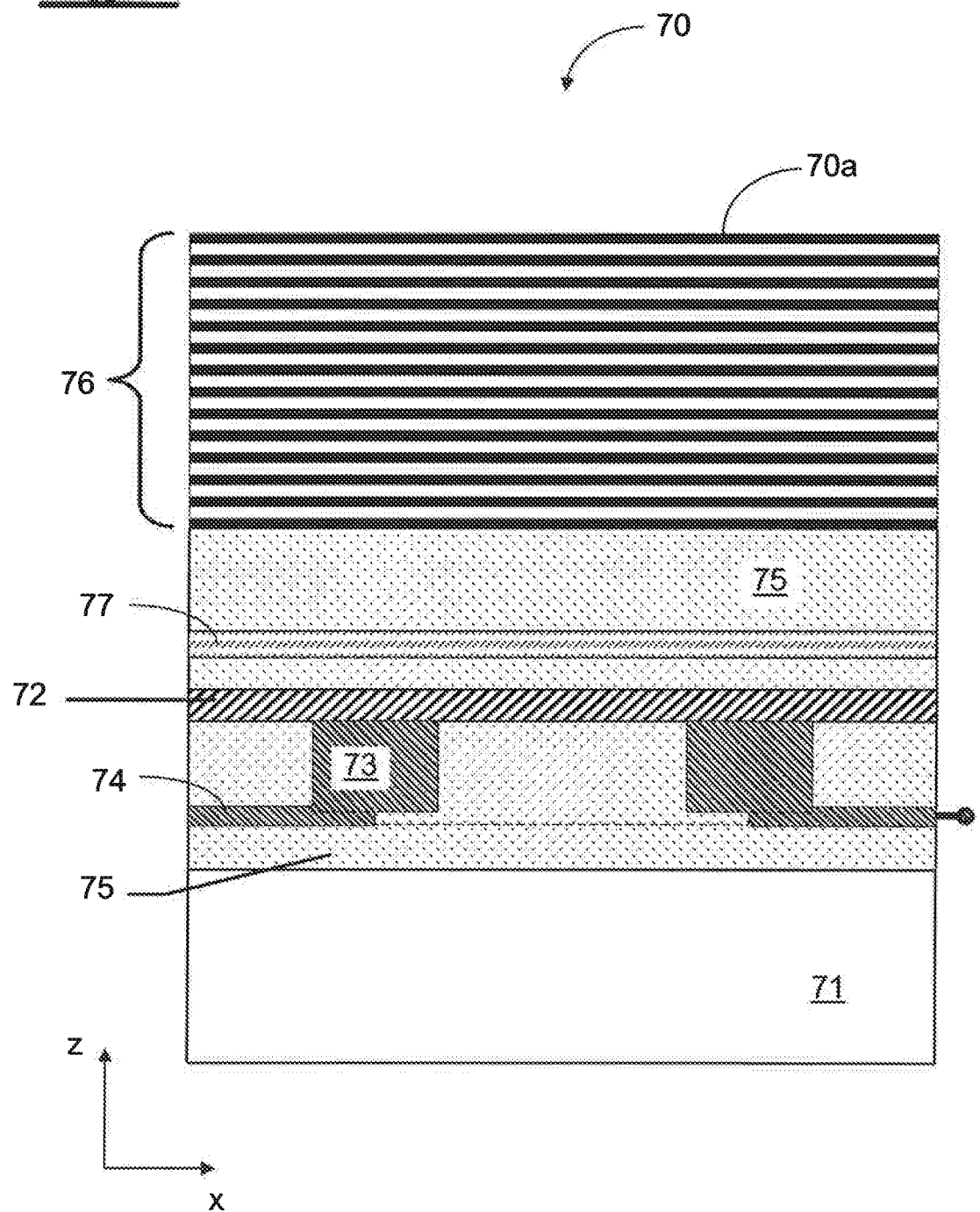

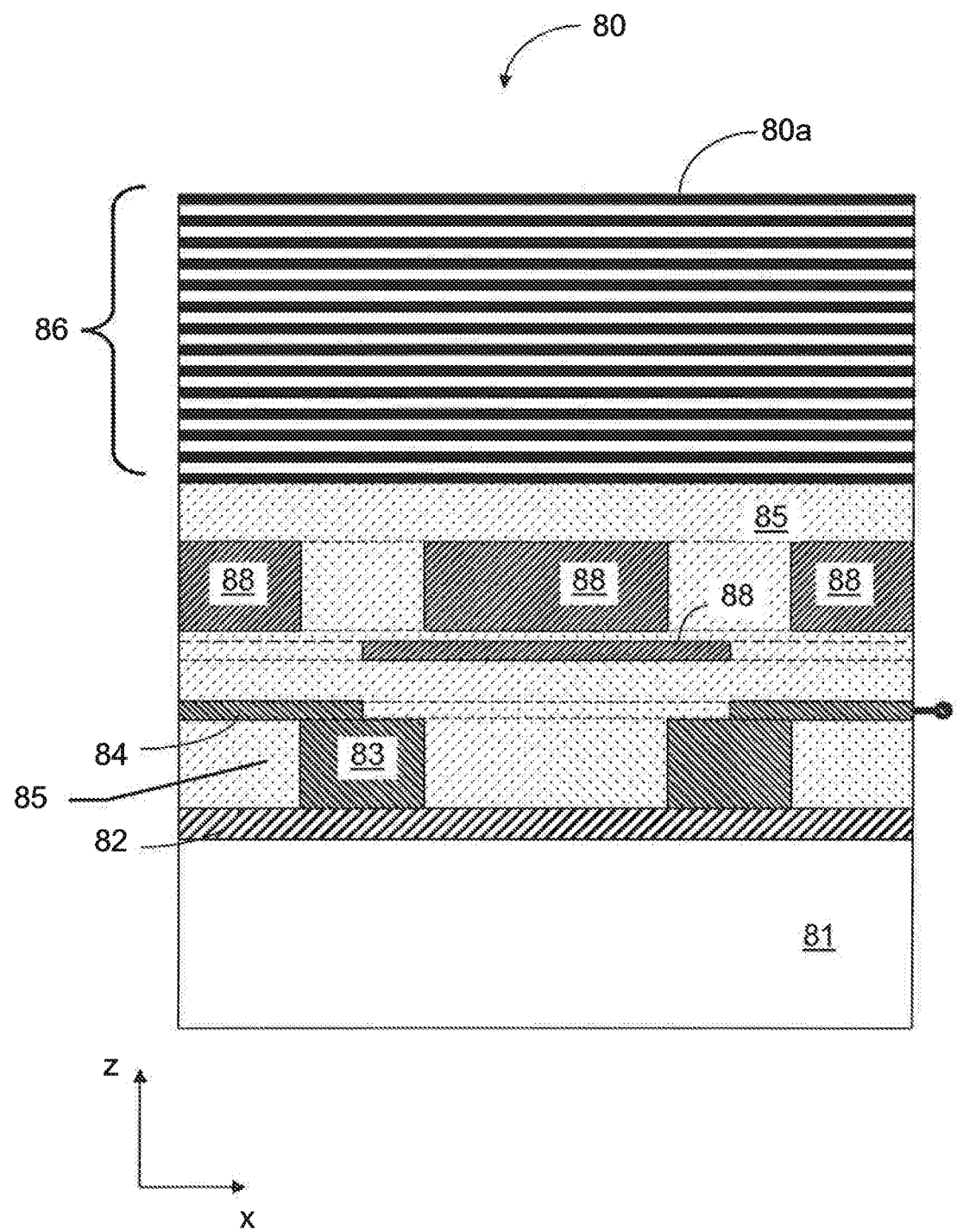

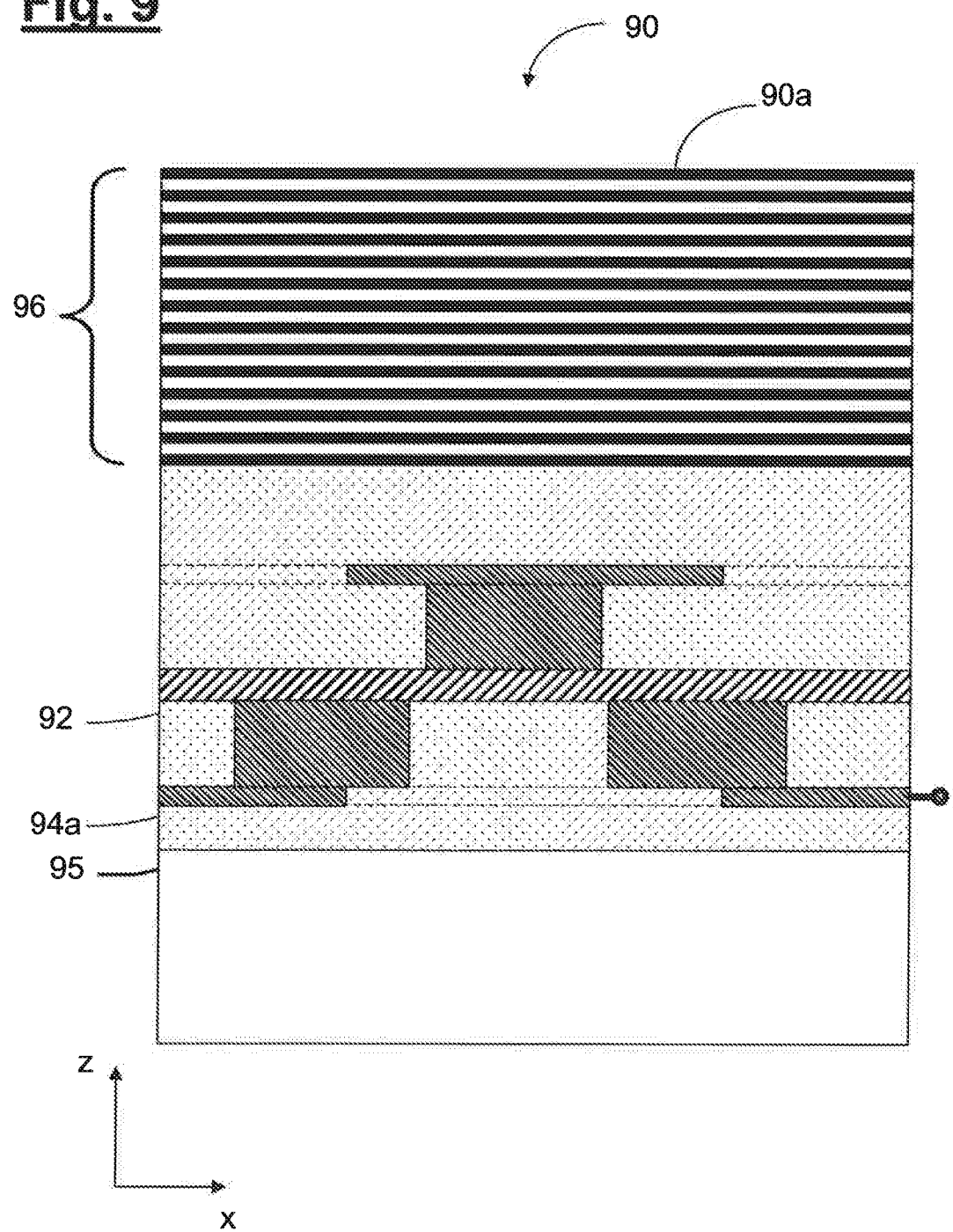

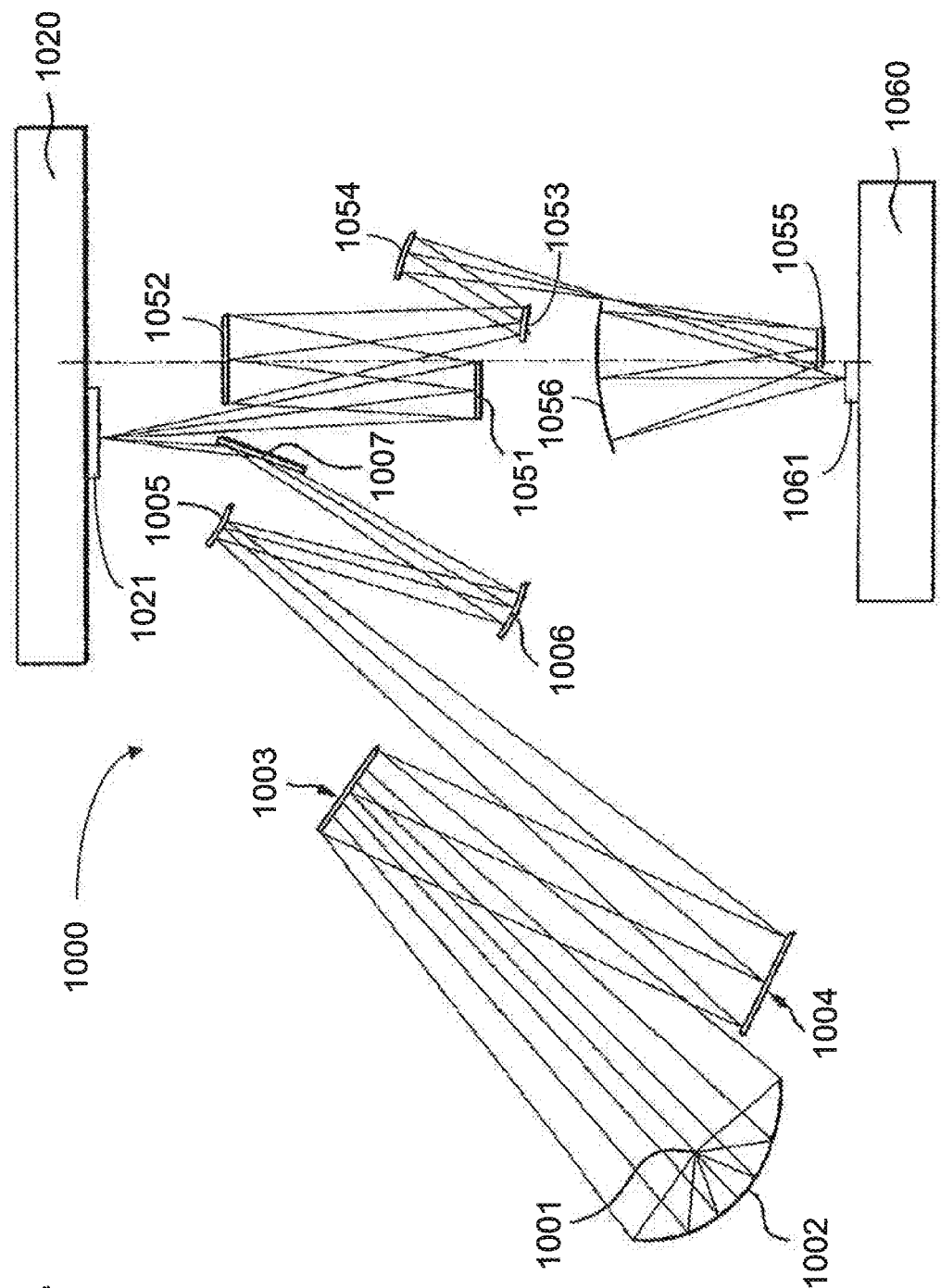

US 10,908,509 B2

MIRROR, IN PARTICULAR FOR A MICROLITHOGRAPHIC PROJECTION EXPOSURE APPARATUS

CROSS REFERENCE TO RELATED APPLICATIONS

This is a Continuation of International Application PCT/EP2018/053769, which has an international filing date of Feb. 15, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 205 405.0 filed on Mar. 30, 2017.

FIELD OF THE INVENTION

The invention relates to a mirror, in particular for a microlithographic projection exposure apparatus.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (=reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In a projection exposure apparatus designed for the EUV range, i.e. at wavelengths of e.g. approximately 13 nm or approximately 7 nm, owing to the lack of availability of suitable light-transmissive refractive materials, reflective optical elements are used as optical components for the imaging process.

In this case, it is known, inter alia, to use wavefront correction elements in order to correct a wavefront aberration that occurs during operation of the optical system. Besides aberrations of the imaging optical unit, it is also possible to correct faults of the reticle and/or of the wafer and further faults that occur in the entire process chain during the production of the structures on the wafer. Aberrations that occur during operation of a projection exposure apparatus designed for EUV may be caused, for example, by the fact that, in particular owing to the absorption of the radiation emitted by the EUV light source, the EUV mirrors experience heating and an attendant thermal expansion or deformation, which may in turn result in an impairment of the imaging properties of the optical system. This is the case in particular if illumination settings with comparatively small illumination poles are used (e.g. in dipole or quadrupole illumination settings), in which the mirror heating or deformation varies greatly over the optical effective surface of the mirror.

One possible approach for overcoming this problem is the configuration of a wavefront correction element with electrically conductive conductor tracks arranged in a distributed manner at at least one surface, the interaction of the wavefront correction element with impinging electromagnetic radiation being able to be influenced by way of the electrical driving of said conductor tracks. The resultant achievable manipulation of the wavefront of the electromagnetic radiation, depending on (transmissive or reflective) configuration, may be based in particular on a change in refractive index and/or deformation of the wavefront correction element brought about by the electrical driving of the conductor tracks.

One problem that occurs here in practice, however, is that during the production process of the wavefront correction element and/or during operation thereof, an electrical charging of a surface of the wavefront correction element vis-à-vis the conductor tracks buried in an insulation layer can take place, wherein as the electric field strength increases, an electrical breakdown through the relevant insulation layer can ultimately take place. The attendant flashlike electrical discharge can result in partial melting through to damage or even destruction of the conductor tracks and possibly electrical components connected thereto.

Furthermore, the production process of such wavefront correction elements turns out to be comparatively complex on account of the manufacturing steps to be carried out in part outside the coating apparatus.

Further known approaches include the use of infrared (IR) heating devices, which, however, has inter alia the disadvantage of the generation of comparatively high thermal loads outside the region that is actually to be heated up in each case (in particular also in the region of adjacent optical components).

With regard to the prior art, reference is made merely by way of example to DE 10 2006 045 075 A1, U.S. Pat. No. 8,508,854 B2, U.S. Pat. No. 7,112,772 B2, EP 0 965 871 B1, WO 2004/036316 A1, EP 1 103 857 B1, DE 10 2012 212 757 A1 and EP 2 103 978 A1.

SUMMARY

It is an object of the present invention to provide a mirror, in particular for a microlithographic projection exposure apparatus, which mirror makes possible a setting of temperature fields varying laterally over the mirror surface, which setting is locally delimited to the mirror, and at the same time is producible in a comparatively simple and robust manufacturing process.

A mirror according to one formulation of the invention has an optical effective surface, as well as:
 a substrate;
 a reflection layer system for reflecting electromagnetic radiation impinging on the optical effective surface;
 an electrode arrangement composed of a first material having a first electrical conductivity, said electrode arrangement being provided on the substrate; and
 a mediator layer composed of a second material having a second electrical conductivity;
 wherein the ratio between the first electrical conductivity and the second electrical conductivity is at least 100;
 wherein the mirror comprises at least one compensation layer which at least partly compensates for the influence of a thermal expansion of the electrode arrangement on the deformation of the optical effective surface.

The disclosure furthermore comprises a mirror, wherein the mirror has an optical effective surface, comprising a substrate, a reflection layer system for reflecting electromagnetic radiation impinging on the optical effective surface, an electrode arrangement composed of a first material having a first electrical conductivity, said electrode arrangement being provided on the substrate, and a mediator layer composed of a second material having a second electrical conductivity, wherein the ratio between the first electrical conductivity and the second electrical conductivity is at least 100.

In accordance with one embodiment, a wavefront of electromagnetic radiation impinging on the mirror is manipulatable by electrical driving of the electrode arrangement and an attendant thermally induced deformation of the optical effective surface.

In accordance with a further embodiment, electrical driving of the electrode arrangement sets the surface temperature of the mirror such that across the optical effective surface a maximum local deviation—occurring during operation of the mirror—of the surface temperature from the zero crossing temperature of the coefficient of thermal expansion is less than 5 kelvins (K).

The invention can firstly be applied to keep the surface temperature of a mirror constant even though the power consumption and the distribution thereof on the mirror varies over time for example as a result of the absorbed (EUV) used light. Secondly, the invention can also be applied to correct ascertained aberrations in the imaging with the aid of a deformation, by setting a targeted deformation of the mirror as a result of local temperature variations.

The present invention makes use, inter alia, of the concept, in particular, of realizing the generation of a temperature field varying laterally over the mirror surface by way of the combined use of an electrode arrangement and a mediator layer (serving as "heating layer"). In this construction, the heat required for providing the desired temperature field is generated in the mediator layer by way of an electric current flowing between the individual electrodes of the electrode arrangement with the consequence of firstly realizing a locally variable mirror heating that is settable in a targeted manner, but secondly also of significantly simplifying the production process on account of the comparatively simple layer construction (in which the mediator layer can be embodied e.g. substantially homogeneously and with a constant thickness and the number of electrodes in the electrode arrangement is also permitted to be comparatively small on account of the use of the mediator layer).

As a result, in one aspect, the invention achieves the precise setting—restricted in particular locally to the mirror itself—of a desired temperature distribution—and thus also e.g. the corresponding correction of thermally induced surface deformations—with a comparatively simple and robust construction for instance with regard to the electrode arrangement. In this case, in particular in an advantageous manner in respect of manufacturing aspects, the individual process steps during the production of the relevant mirror components according to the invention can be carried out directly successively and without temporarily leaving the coating apparatus.

According to another aspect of the invention, the mirror comprises at least one compensation layer which at least partly compensates for the influence of a thermal expansion of the electrode arrangement on the deformation of the optical effective surface. In this case, the compensation layer makes it possible to compensate for an unavoidable thermal expansion of the electrode arrangement and of electrical leads present with regard to the contribution to the deformation of the optical effective surface, with the consequence that a locally constant or uniform "deformation response" to a coupled-in temperature field results in total.

In accordance with one embodiment, the mirror comprises at least one cooling element. In this case, preferably, the cooling power of the at least one cooling element can be dynamically adapted to the heating power provided by way of the combination of mediator layer and electrode arrangement. As a result, in the construction according to the invention (in which the electrodes, as already explained, can each have a relatively large cross section relative to the conventional wavefront correction elements described in the introduction) it is thus possible to obtain a variation of the heating power provided overall over a comparatively large region. Merely by way of example, the electrodes, the mediator layer and the leads can have in cross section a thickness in the range of 10 nm to 5 µm, in particular in the range of 50 nm to 500 nm. Furthermore, the electrodes can be distributed over the entire area and be spaced apart from one another by (gap) spacings of more than 1 µm, in particular of more than 1 mm, for the purpose of insulation.

In accordance with one embodiment, the compensation layer has an area occupation substantially complementary to the electrode arrangement and/or the lead arrangement. In this case, the invention includes the concept, in particular, of allowing a "planar" area to arise again by virtue of the fact that, with the compensation layer, an additional layer having inverse area occupation is added to the layer construction. In this case, in order to obtain the desired compensation effect, the respective values of the product of local thickness and coefficient of thermal expansion for the compensation layer, on the one hand, and the electrode arrangement, on the other hand, in terms of absolute value, preferably correspond up to 50%, more particularly up to 20%.

In accordance with one embodiment, the compensation layer comprises a material having a coefficient of thermal expansion having an opposite sign to the coefficient of thermal expansion of the first material. Appropriate materials therefor are e.g. zinc cyanide and zirconium tungstate. Here, too, in order to obtain the desired compensation effect, the respective values of the product of local thickness and coefficient of thermal expansion for the compensation layer, on the one hand, and the electrode arrangement, on the other hand, in terms of absolute value, preferably correspond up to 50%, more particularly up to 20%. Furthermore, the compensation layer in this embodiment preferably has an area occupation identical or similar to the electrode arrangement and/or the lead arrangement. In this case, a similar area occupation is understood to mean an area occupation for which the maximum edge offset between electrode arrangement and/or lead arrangement, on the one hand, and compensation layer, on the other hand, is less than 30% relative to the width of the leads and/or the maximum diameter of the electrodes.

The compensation layer can constitute a conductive layer, in principle, which can also be contact-connected through to the mediator layer and can thus also be used for applying a signal, whereby advantageously more space for laying lines is created without additional plies.

In accordance with one embodiment, the electrode arrangement comprises a plurality of electrodes arranged offset with respect to one another along an azimuthal direction relative to an optical element axis of the mirror. Such an azimuthally distributed contact-connection makes it possible to minimize an undesired coupling of mechanical vibrations into the mirror. In embodiments of the invention, for this purpose, a definition of suitable contact-connection positions of the electrode arrangement can also be effected on the basis of a sensitivity analysis carried out beforehand with regard to minimizing a coupling-in of vibrations (wherein the contact-connection can be effected in particular along the node lines of natural oscillation modes of the mirror).

In accordance with one embodiment, the mirror furthermore comprises an absorption layer arranged between the reflection layer system and the electrode arrangement. Such an absorption layer has an advantageous effect during the production process of the mirror according to the invention insofar as an interferometric measurement of the respectively surface-processed layer, which measurement is carried out during manufacturing typically before the reflection layer system is applied, can be effected without any influencing of the measurement by the structures present at the mediator layer or the electrode arrangement. In other words, such an absorption layer enables a precise surface processing which is not impaired by the electrode arrangement or mediator layer according to the invention.

In accordance with one embodiment, the mirror is designed for an operating wavelength of less than 200 nm.

In accordance with a further embodiment, the mirror is designed for an operating wavelength of less than 30 nm, in particular less than 15 nm.

The invention furthermore relates to an optical system of a microlithographic projection exposure apparatus, in particular an illumination device or a projection lens, and to a microlithographic projection exposure apparatus comprising at least one mirror according to the invention.

Further configurations of the invention can be gathered from the description and the dependent claims.

The invention is explained in greater detail below on the basis of exemplary embodiments that are illustrated in the accompanying figures.

BRIEF DESCRIPTION OF THE DRAWINGS

FIG. 7 shows another embodiment, which provides an absorption layer,

FIG. 8 shows another embodiment, which provides an additional compensation layer;

FIG. 9 shows another embodiment, in which one of the electrodes doubles as a compensation layer; and FIG. 10 shows a schematic illustration of the possible construction of a microlithographic projection exposure apparatus designed for operation in the EUV.

DETAILED DESCRIPTION

FIG. 10 shows a schematic illustration of an exemplary projection exposure apparatus 1000 which is designed for operation in the EUV and in which the present invention can be realized.

According to FIG. 10, an illumination device in a projection exposure apparatus 1000 designed for EUV comprises a field facet mirror 1003 and a pupil facet mirror 1004. The light from a light source unit comprising a plasma light source 1001 and a collector mirror 1002 is directed onto the field facet mirror 1003. A first telescope mirror 1005 and a second telescope mirror 1006 are arranged in the light path downstream of the pupil facet mirror 1004. A deflection mirror 1007 is arranged downstream in the light path, said deflection mirror directing the radiation that is incident thereon onto an object field in the object plane of a projection lens, which includes six mirrors 1051-1056. At the location of the object field, a reflective structure-bearing mask 1021 is arranged on a mask stage 1020. This mask is imaged with the aid of the projection lens into an image plane in which a substrate 1061 coated with a light-sensitive layer (photoresist) is situated on a wafer stage 1060.

During operation of the projection exposure apparatus 1000, it is then possible for at least one arbitrary mirror to be embodied for correcting wavefront aberrations that occur, wherein possible configurations of this mirror are described below with reference to the schematic illustrations in FIGS. 2-7.

Figure 1:
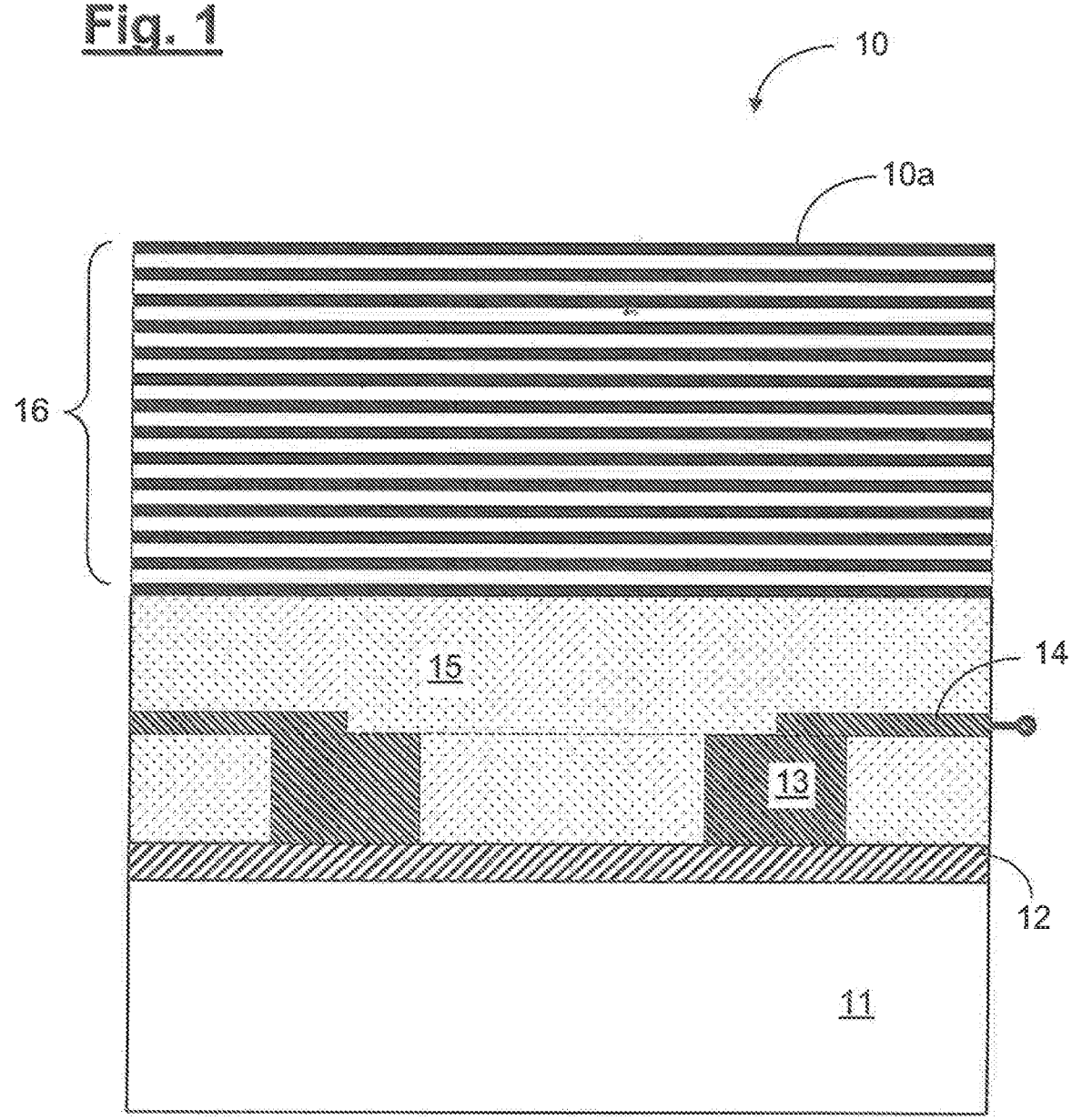
FIG. 1 shows a schematic illustration for explaining a first embodiment of the invention.

FIG. 1 shows a schematic illustration for explaining the construction of a mirror in which the invention can be realized. The mirror 10 can be in particular an EUV mirror of an optical system, in particular of the projection lens or of the illumination device of a microlithographic projection exposure apparatus.

The mirror 10 comprises in particular a mirror substrate 11, which is produced from any desired suitable mirror substrate material. Suitable mirror substrate materials are e.g. quartz glass doped with titanium dioxide ($TiO_2$), with materials that are usable being, merely by way of example (and without the invention being restricted thereto), those sold under the trade names ULE® (from Corning Inc.) or Zerodur® (from Schott AG). Furthermore, the mirror 10 comprises, in a manner known per se in principle, a reflection layer system 16, which, in the embodiment illustrated, comprises merely by way of example a molybdenum-silicon (Mo—Si) layer stack.

Without the invention being restricted to specific configurations of the reflection layer system, one suitable construction that is merely by way of example can comprise approximately 50 plies or layer packets of a layer system comprising molybdenum (Mo) layers having a layer thickness of in each case 2.4 nm and silicon (Si) layers having a layer thickness of in each case 3.3 nm.

The impingement of electromagnetic EUV radiation on the optical effective surface 10a of the mirror 10 during operation of the optical system can result in an inhomogeneous volume change of the mirror substrate 11 on account of the temperature distribution which results from the absorption of radiation impinging inhomogeneously on the optical effective surface 10a. In order to correct such an undesired volume change or else in order to correct other aberrations that occur during operation of the microlithographic projection exposure apparatus, the mirror 10 is then designed in a manner according to the invention, as is explained in greater detail below.

It should be pointed out that in the abovementioned mirror substrate materials at the so-called zero crossing temperature, the coefficient of thermal expansion has a zero crossing in its temperature dependence, in the vicinity of which zero crossing no or only a negligible thermal expansion takes place. Consequently, in specific scenarios, it may also be sufficient to keep the mirror at said zero crossing temperature. In the case of a mirror having finite thermal expansion, the deformation can be controlled by way of the adaptation of the local power. In this case, it can be advantageous to provide a certain heating power continuously, which can be regulated downward or switched off as necessary, as a result of which an additional cooler is dispensable. In this case, it can be expedient to choose the zero crossing temperature of the substrate deliberately to be higher in order, with a corresponding choice of the "operating point", also to be able to remove thermal power and thus to enable an opposite or negative actuating direction.

The mirror 10 according to the invention in accordance with FIG. 1 comprises an electrode arrangement 13 comprising a plurality of electrodes, which are electrically drivable or able to have a selectively settable electric current applied to them via electrical leads 14. Furthermore, the mirror 10 comprises an electrically conductive mediator layer 12.

In FIG. 1, "15" denotes a smoothing and insulation layer, which electrically insulates in particular the electrodes of the electrode arrangement 13 from one another and can be produced from quartz glass ($SiO_2$), for example.

In further embodiments, the mirror can also be configured for use with so-called grazing incidence. In this case, the reflection layer system can comprise for example in particular just one individual layer composed of e.g. ruthenium (Ru) having an exemplary thickness of 30 nm.

Furthermore, additional functional layers (such as e.g. diffusion barrier layers, adhesion-enhancing layers, etc.), not depicted in FIG. 1, can also be provided in the layer construction of the mirror 10.

During operation of the mirror 10 according to the invention, different electrical potentials can be applied to the individual electrodes of the electrode arrangement 13, wherein the electrical voltages generated thereby between the electrodes bring about an electric current flow via the mediator layer 12. The heat induced by said electric current results in a locally varying heating-up of the mirror surface depending on the potentials respectively applied to the electrodes.

As a result, the combined use of electrode arrangement 13 and mediator layer 12 in the case of the mirror 10 according to the invention, despite comparatively coarse structures of the electrode arrangement—for instance in comparison with the wavefront correction elements described in the introduction —, enables continuously varying power inputs into the mirror according to the invention, wherein at the same time the coupling-in of the thermal power—in contrast for instance to the conventional use of infrared (IR) heating devices as described in the introduction—is limited to the mirror itself. According to the invention, on account of the material selection, there is a comparatively high electrical resistance in the mediator layer, such that the electrical voltage is dropped there, whereas, on account of the comparatively significantly higher electrical conductivity in the leads, no voltage or heat is dropped in the leads and in this respect fine structures are not required in order to generate the high electrical resistances.

The invention is not restricted to a specific geometric configuration of the electrode arrangement. Merely exemplary configurations of the electrode arrangement and/or leads, which configurations are advantageous in respectively different regards, are described below with reference to FIGS. 2 to 5.

Figure 2:
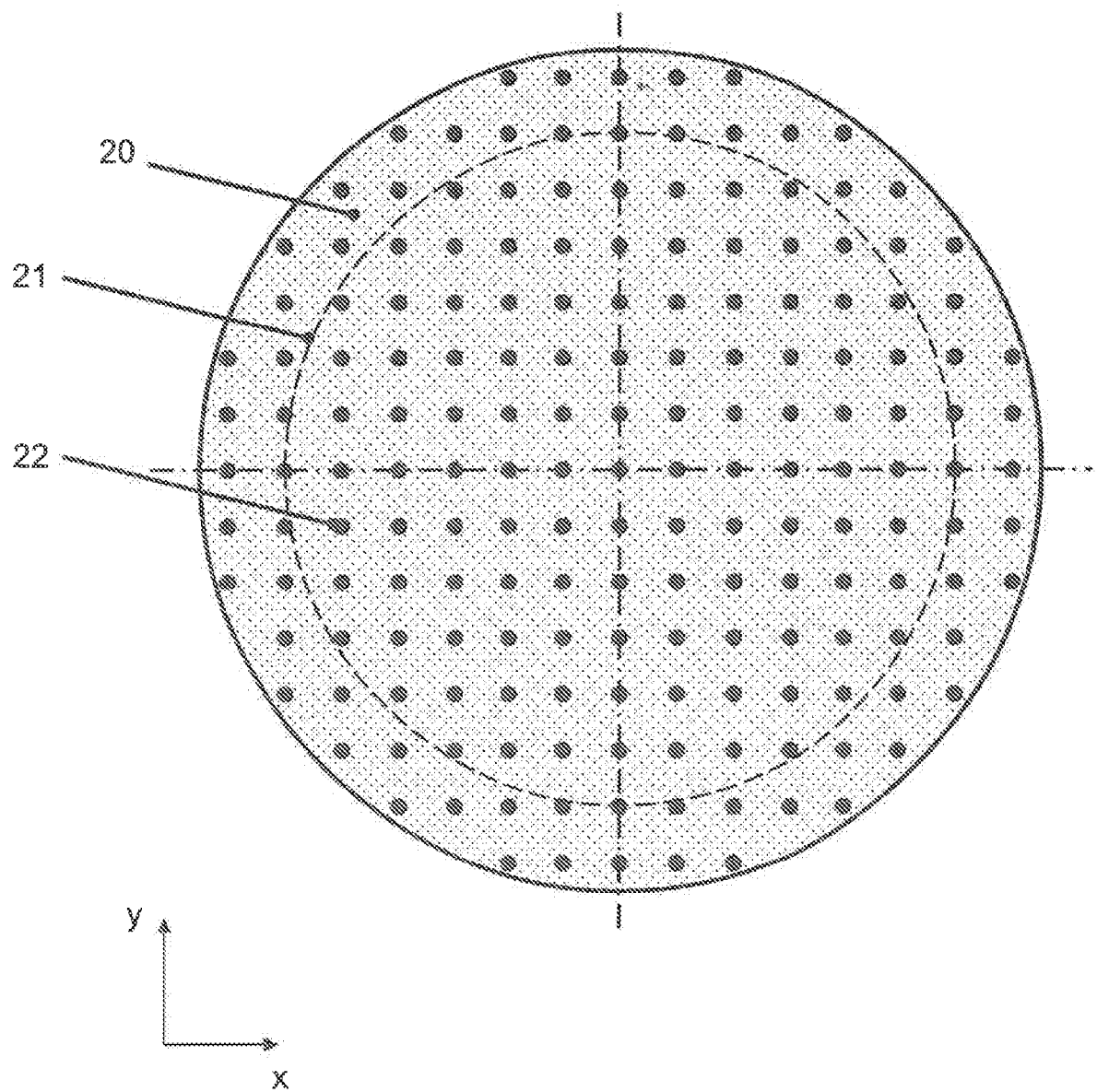
FIG. 2 shows an embodiment of the invention with electrodes distributed over an optical surface.

FIG. 2 shows a configuration in which a multiplicity of electrodes 22 are arranged in a manner distributed over the optical surface (designated by "20") of the mirror, wherein this distribution extends beyond the "footprint" boundary, designating the delimitation of the light beam or of the optically used region on the mirror surface.

The electrodes 22 can be provided in any suitable distributions (e.g. in a Cartesian grid, in a hexagonal arrangement, etc.). In further embodiments, electrodes 22 can also be positioned only in specific regions (e.g. outside the optically used region or the "footprint" boundary 21). In accordance with FIG. 2, the electric current flows possibly transversely across the optically used region.

Figure 3:
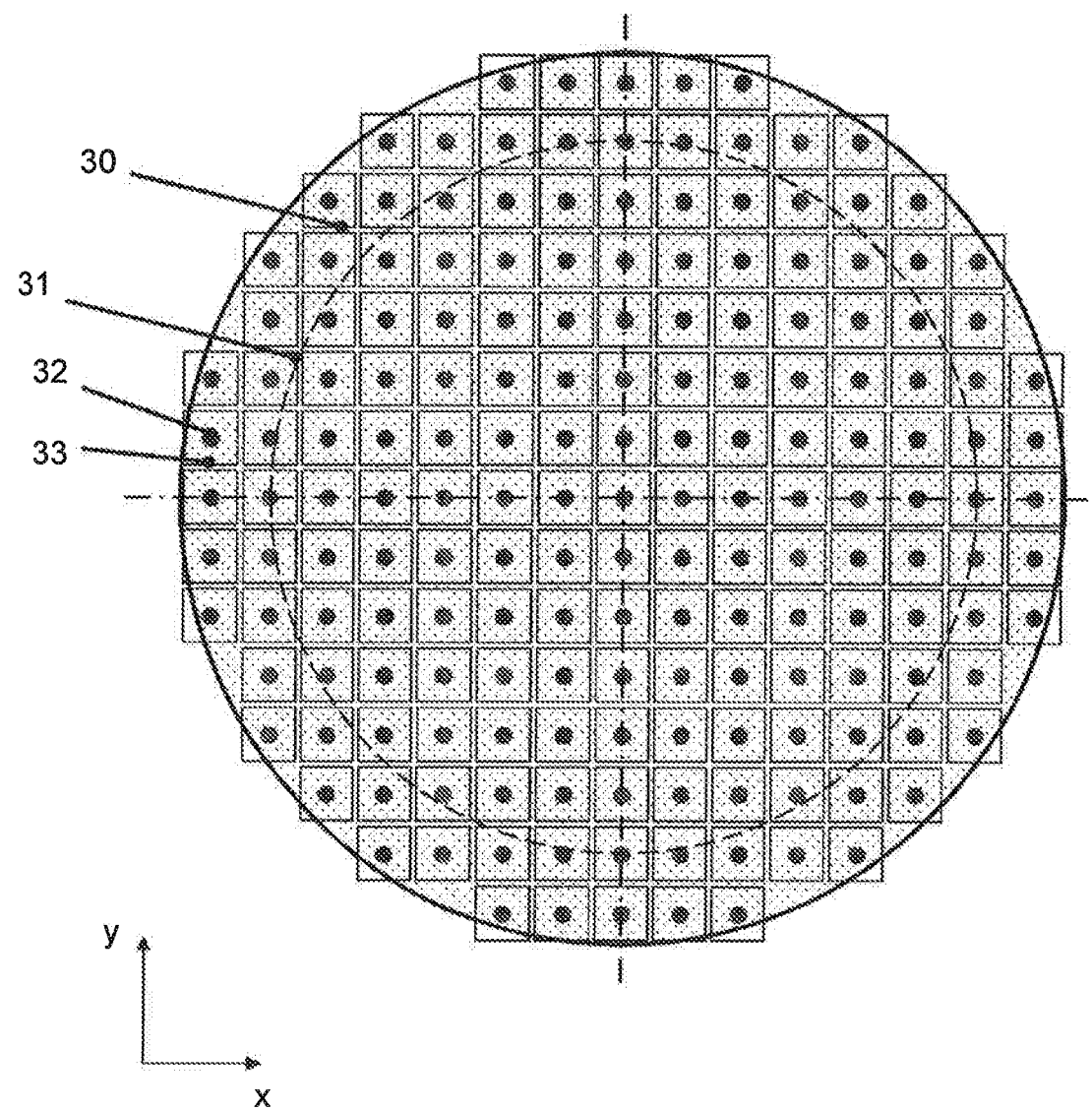
FIG. 3 shows an embodiment of the invention with second electrodes enclosing first electrodes.

FIG. 3 shows a configuration of an electrode arrangement in which first electrodes 32 are enclosed by second electrodes 33 (wherein the second electrodes 33 are embodied in square fashion in the exemplary embodiment, but can also have a different, e.g. circular, geometry independently of the grid chosen).

In the case of the arrangement chosen in FIG. 3, in which the second electrodes 33 enclose the first electrodes 32, an additional ply for the respective leads (as "conduction layer") is required for the second electrodes 33. In further embodiments, however, the second electrodes 33 can also be interrupted or remain open at a respective location, wherein the contact-connection for the respective first electrode 32 can be led through the remaining opening in order to obviate said further conduction layer. In accordance with FIG. 3, the electric current flows in each case between a first electrode 32 and an associated second electrode 33, such that a local current flow and thus also locally heated positions can be realized.

In further embodiments, said second conduction layer can also additionally be used or perform a dual function insofar as it can furthermore serve as a compensation layer which, as additionally explained below, compensates for an unavoidable thermal expansion of the electrode arrangement and/or of the associated leads.

Figure 4B:
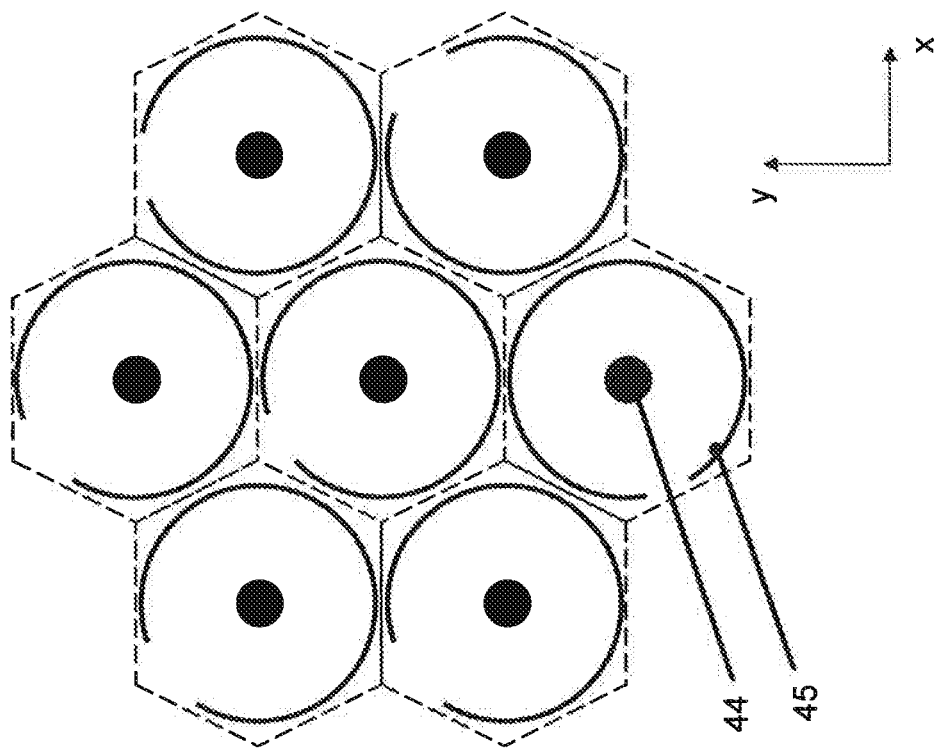
FIGS. 4A and 4B show further embodiments, with hexagonal arrangements of first electrodes with closed (FIG. 4A) and open (FIG. 4B) second electrodes.
Figure 4A:
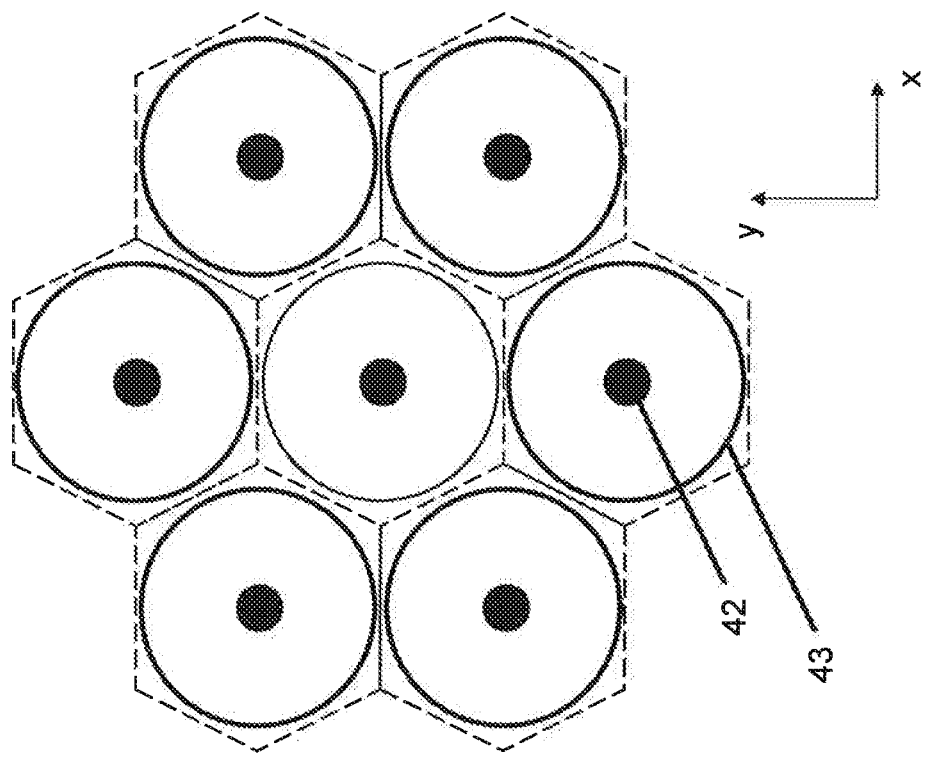

FIG. 4A shows, in a further exemplary embodiment, a hexagonal arrangement of first electrodes 42 surrounded respectively by ring-shaped second electrodes 43. This configuration is advantageous, inter alia, with regard to the uniform grid and the respectively constant distance between first and second electrodes 42, 43 assigned to one another.

FIG. 4B shows a configuration substantially analogous to FIG. 4A and comprising first electrodes 44 and second electrodes 45, wherein this arrangement differs from that from FIG. 4A merely in that the second electrodes 45 are interrupted in order to obviate the additional conduction layer as mentioned above. However, as described above, the additional conduction layer required in the exemplary embodiment in FIG. 4A can also serve as a compensation layer for compensating for the thermal expansion of the electrode arrangement and/or of the leads. For this purpose, e.g. the conduction layers containing the respective leads for the first and/or second electrodes can be embodied with inverse area occupation or opposite coefficients of thermal expansion.

Figure 5:
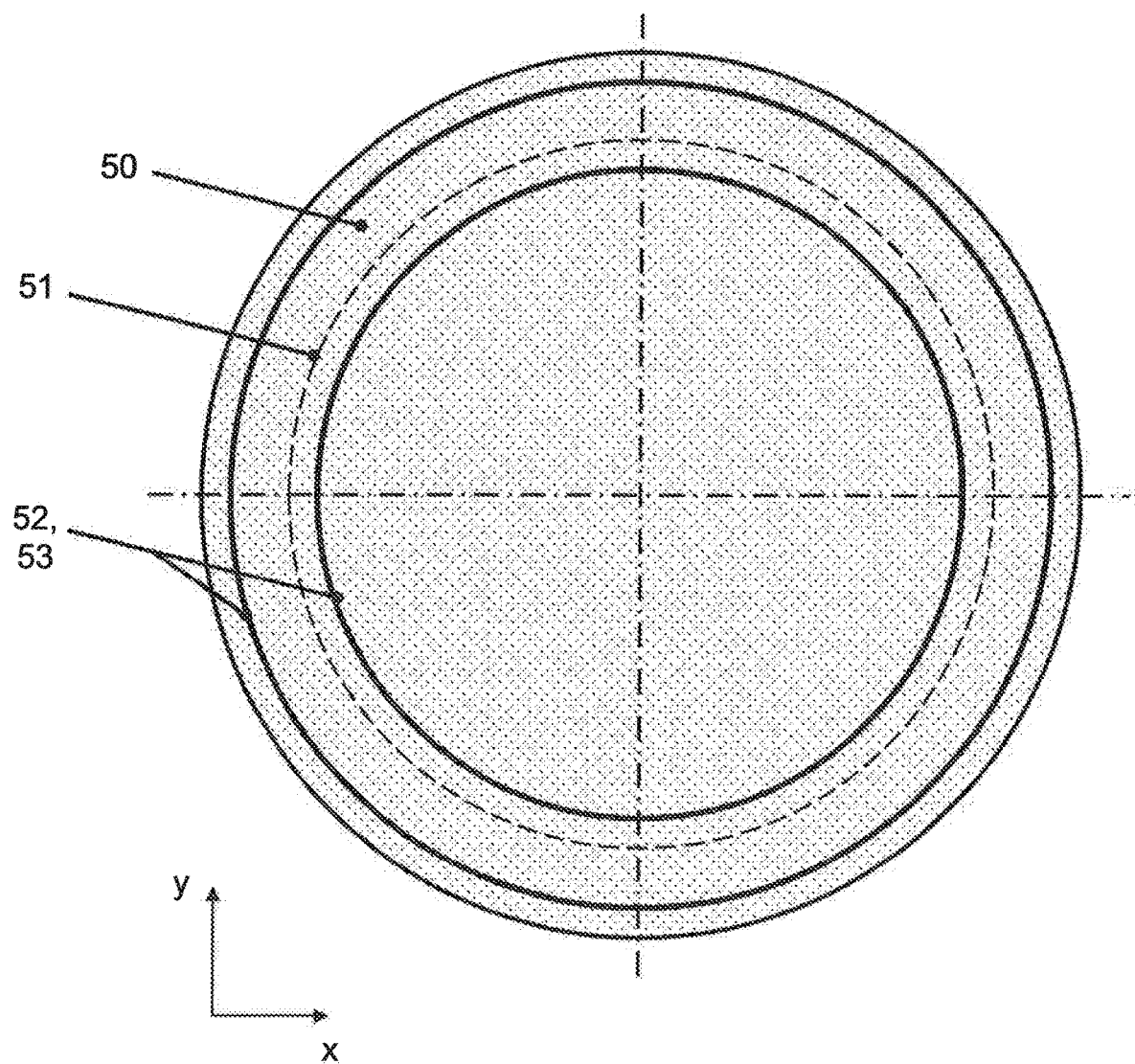
FIG. 5 shows an arrangement of two electrodes providing ring field heating.

FIG. 5 shows an exemplary embodiment in which the selective drivability of individual zones of the electrode arrangement is dispensed with in favor of a significantly reduced integration outlay or a reduction of the required number of electrical connections, provision being made here of just two electrodes 52, 53 for realizing a ring field heating. "51" denotes the delimitation of the light beam or of the optically used region on the mirror surface ("footprint boundary").

Figure 6:
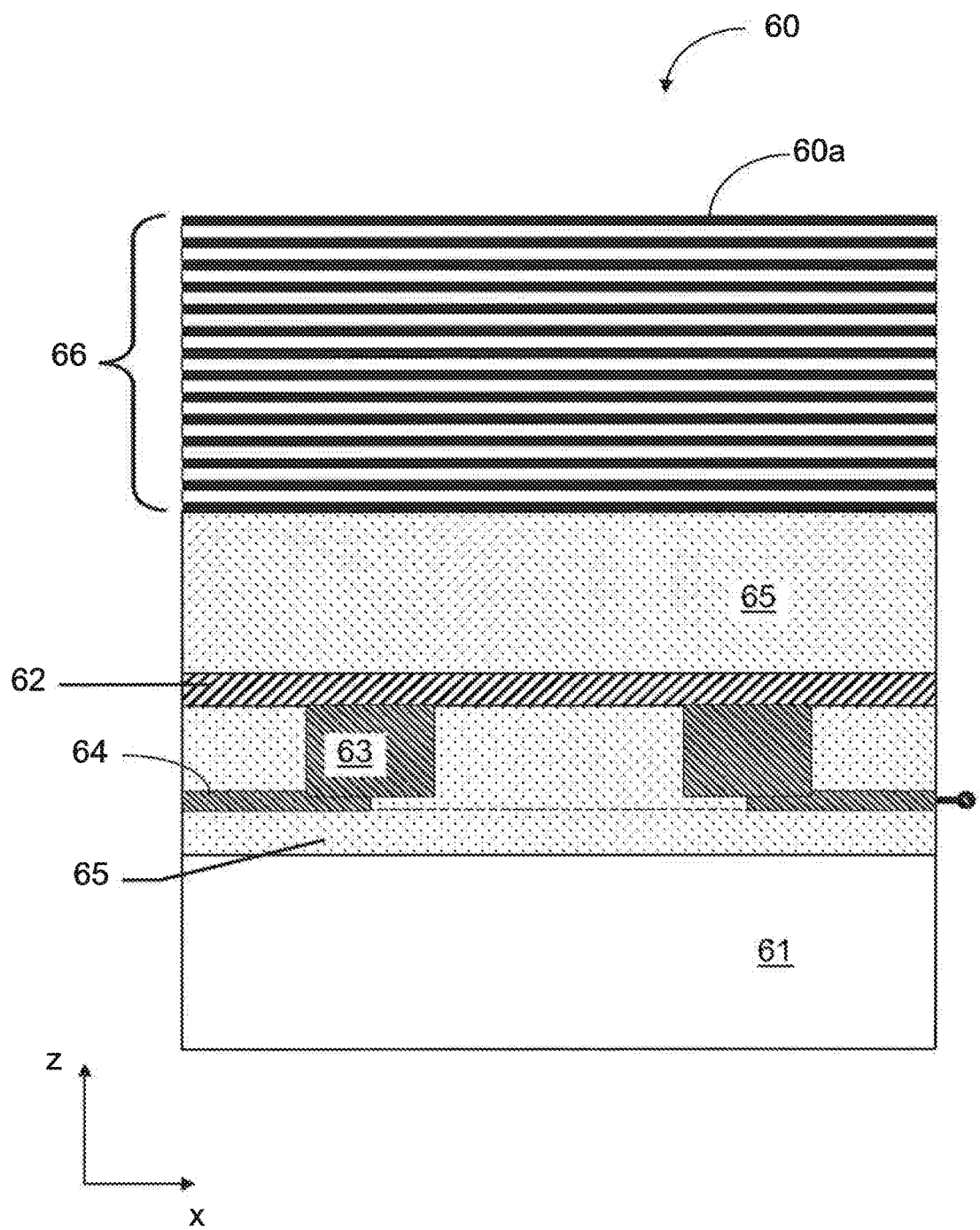
FIG. 6 shows another embodiment, which reverses the electrode arrangement shown in FIG. 1.

FIG. 6 shows an alternative configuration to FIG. 1 of the layer sequence of the mirror according to the invention, wherein components analogous or substantially functionally identical in comparison with FIG. 1 are designated by reference numerals increased by "50."

In accordance with FIG. 6, the layer construction is reversed in comparison with FIG. 1 with regard to electrode arrangement 63 and mediator layer 62 insofar as, in accordance with FIG. 6, the mediator layer 62 is arranged on the side of the electrode arrangement 63 facing the reflection layer system 66 or on the side of said electrode arrangement facing away from the substrate 61. Particularly in the case of an absorbent (="black") configuration of the mediator layer 62, the configuration in accordance with FIG. 6 can be advantageous insofar as then the interferometric measurement—typically effected during the manufacturing process—of the surface to be processed in each case (before the reflection layer system 66 is applied) is not influenced by the electrode arrangement 63 (which in this embodiment is no longer visible to the impinging electromagnetic radiation), such that a precise interferometric surface measurement and correspondingly reliable surface processing can be effected as a result.

In a further embodiment, illustrated in FIG. 7, the effect already described above (i.e. the "masking" of the electrode arrangement for interferometric measurement radiation during the manufacturing process) is achieved with an absorption layer 77 provided specifically for this purpose, said absorption layer being arranged between reflection layer system 76 and electrode arrangement 73. For the rest, in FIG. 7, components analogous or substantially functionally identical in comparison with the construction in FIG. 6 are designated by reference numerals increased in turn by "10".

FIG. 8 shows a further configuration of the layer sequence of the mirror according to the invention, wherein components which are analogous or substantially functionally identical in comparison with FIG. 1 are designated by reference numerals increased by "70". In accordance with this embodiment, provision is made of at least one additional compensation layer 88 having an area occupation complementary to the electrode arrangement 83 and/or the leads 84 and/or a thickness profile complementary to the electrode arrangement and/or the leads 84. In accordance with this embodiment, the invention thus includes the concept of allowing a "planar" area to arise again by virtue of the fact that an additional layer having inverse area occupation is added with the at least one compensation layer 88.

The compensation layer can constitute a conductive layer, in principle, which can also be contact-connected through to the mediator layer and can thus also be used for applying a signal, whereby advantageously more space for laying lines is created without additional plies. FIG. 9 shows a further configuration of the layer sequence of the mirror according to the invention, wherein components which are analogous or substantially functionally identical in comparison with FIG. 1 are designated by reference numerals increased by "80". In accordance with FIG. 9, both first electrodes 93a and second electrodes 93b (which here perform the additional function of a compensation layer analogously to the embodiment in FIG. 8) are electrically contact-connected to the mediator layer 92. By virtue of the fact that the compensation layer in FIG. 9 is simultaneously used as an electrode 93b, additional plies are obviated and the available space is better utilized.

Even though the invention has been described on the basis of specific embodiments, numerous variations and alternative embodiments are apparent to a person skilled in the art, for example by combination and/or exchange of features of individual embodiments. Accordingly, it goes without saying for a person skilled in the art that such variations and alternative embodiments are concomitantly encompassed by the present invention, and the scope of the invention is restricted only within the meaning of the accompanying patent claims and the equivalents thereof.

What is claimed is:

1. A mirror having an optical effective surface, comprising:
    a substrate;
    a reflection layer system for reflecting electromagnetic radiation impinging on the optical effective surface;
    an electrode arrangement provided on the substrate and composed of a first material having a first electrical conductivity;
    a mediator layer composed of a second material having a second electrical conductivity; wherein a ratio between the first electrical conductivity and the second electrical conductivity is at least 100; and
    at least one compensation layer which at least partly compensates for a thermal expansion of the electrode arrangement on deformation of the optical effective surface;
    wherein the electrode arrangement and the mediator layer are formed such that by electrical driving of the electrode arrangement, heat required for providing a temperature field that varies laterally over the optical effective surface is generated in the mediator layer, and
    wherein the electrode arrangement and the mediator layer are configured to produce current that flows transversely with respect to the optical effective surface through the mediator layer between at least two electrodes of the electrode arrangement.

2. The mirror as claimed in claim 1, wherein the electrode arrangement is configured to be electrically driven and thereby thermally induce deformation of the optical effective surface, in order to manipulate a wavefront of the electromagnetic radiation impinging on the optical effective surface of the mirror.

3. The mirror as claimed in claim 1, wherein, the electrical driving of the electrode arrangement sets the surface temperature of the mirror such that, across the optical effective surface, a maximum local deviation —occurring during operation of the mirror —of the surface temperature from a zero crossing temperature of the coefficient of thermal expansion is less than 5 kelvins (K).

4. The mirror as claimed in claim 1, wherein the ratio between the first electrical conductivity and the second electrical conductivity is at least 1000.

5. The mirror as claimed in claim 1, wherein the mediator layer has an electrical conductivity of less than 10 000 siemens/meter (S/m).

6. The mirror as claimed in claim 5, wherein the electrical conductivity of the mediator layer is less 200 siemens/meter (S/m).

7. The mirror as claimed in claim 1, wherein the first material is selected from the group consisting essentially of platinum (Pt), palladium (Pd), silver (Ag), copper (Cu), Gold (Au), aluminum (Al), zinc (Zn), tin (Sn), nickel (Ni), tungsten (W), magnesium (Mg), and alloys thereof.

8. The mirror as claimed in claim 1, wherein the second material is selected from the group consisting essentially of electrically conductive oxides, electrically conductive carbides, electrically conductive borides, electrically conductive nitrides and metallic semiconductors.

9. The mirror as claimed in claim 8, wherein the electrically conductive oxides are selected from $LaNiO_3$, $SrCoO_3$, $SrRuO_3$, $SrTiO_3$, and $CaMnO_3$, and wherein the metallic semiconductors are selected from germanium (Ge) and silicon (Si).

10. The mirror as claimed in claim 1, further comprising an insulation layer, which electrically insulates mutually different electrodes of the electrode arrangement from one another.

11. The mirror as claimed in claim 10, wherein the insulation layer is produced from quartz glass (SiO$_2$).

12. The mirror as claimed in claim 1, further comprising at least one cooling element.

13. The mirror as claimed in claim 1, wherein the compensation layer has an area occupation substantially complementary to the electrode arrangement.

14. The mirror as claimed in claim 1, wherein the compensation layer comprises a material having a coefficient of thermal expansion having an opposite sign to a coefficient of thermal expansion of the first material.

15. The mirror as claimed in claim 1, wherein the electrode arrangement comprises a plurality of electrodes arranged offset with respect to one another along an azimuthal direction relative to an optical element axis of the mirror.

16. The mirror as claimed in claim 1, further comprising an absorption layer arranged between the reflection layer system and the electrode arrangement.

17. The mirror as claimed in claim 1 and configured for an operating wavelength of less than 200 nm.

18. The mirror as claimed in claim 1 and configured for an operating wavelength of less than 30 nm.

19. An optical system of a microlithographic projection exposure apparatus configured as an illumination device or a projection lens, and comprising at least one mirror embodied as claimed in claim 1.

20. A microlithographic projection exposure apparatus comprising an illumination device and a projection lens, wherein the projection exposure apparatus comprises a mirror embodied as claimed in claim 1.

* * * * *

UNITED STATES PATENT AND TRADEMARK OFFICE
CERTIFICATE OF CORRECTION

PATENT NO. : 10,908,509 B2
APPLICATION NO. : 16/587974
DATED : February 2, 2021
INVENTOR(S) : Lippert et al.

Page 1 of 1

It is certified that error appears in the above-identified patent and that said Letters Patent is hereby corrected as shown below:

In the Specification

Column 1, Line 8, After "Application" insert -- No. --.

Column 1, Line 14, After "Application" insert -- No. --.

Column 5, Line 47, Delete "layer," and insert -- layer; --, therefor.

Signed and Sealed this
Twenty-fifth Day of May, 2021

Drew Hirshfeld
*Performing the Functions and Duties of the
Under Secretary of Commerce for Intellectual Property and
Director of the United States Patent and Trademark Office*